United States Patent [19]

Izadpanah

[11] Patent Number: 4,980,891
[45] Date of Patent: Dec. 25, 1990

[54] CLOCKED OPTICAL REGENERATOR AND OTHER OPTOELECTRONIC FUNCTIONAL CIRCUITS

[75] Inventor: Hossein Izadpanah, Randolph, N.J.

[73] Assignee: Bell Communications Research, Inc., Livingston, N.J.

[21] Appl. No.: 455,079

[22] Filed: Dec. 22, 1989

[51] Int. Cl.$^5$ .............................................. H01J 3/10
[52] U.S. Cl. ....................................... 372/25; 372/38; 455/607; 455/610; 455/601
[58] Field of Search ................... 372/25, 26, 38, 8, 29, 372/30, 31; 455/608, 609, 610, 601

[56] References Cited

U.S. PATENT DOCUMENTS

| | | | |
|---|---|---|---|
| 3,319,080 | 5/1967 | Cornely et al. | 372/38 |
| 3,845,293 | 10/1974 | Borner | 455/609 |
| 3,896,398 | 7/1975 | Ueki | 372/26 |
| 3,925,735 | 12/1975 | Ozeki et al. | 372/26 |
| 4,019,048 | 4/1977 | Maione et al. | 455/609 |
| 4,484,144 | 11/1984 | Nakagome et al. | 455/610 |
| 4,734,910 | 3/1988 | Izadpanah | 372/38 |
| 4,809,286 | 2/1989 | Kollanyi et al. | 372/26 |
| 4,833,680 | 5/1989 | Kaiser et al. | 455/609 |

*Primary Examiner*—Frank Gonzalez
*Assistant Examiner*—Susan S. Morse
*Attorney, Agent, or Firm*—James W. Falk; Stephen M. Gurey

[57] ABSTRACT

A diode laser amplifier used as a clocked optical regenerator and other diode laser amplifier optoelectronic functional circuits are disclosed. In the regenerator circuit (101), the input optical pulse data signal to be regenerated is inputed to a diode laser amplifier (102), the gain of which is modulated by a clock signal electronically recovered from and synchronized with the input data signal. By modulating the gain so that it is substantially attenuated during essentially half of each bit interval, and at a high gain level during the other half of the bit interval, each pulse in the input signal is both amplified and "cleaned up" produce an output pulse signal that is an amplified, reshaped and retimed version of the input optical signal. In other embodiments the modulated diode laser amplifier (102) is used as an electrooptic modulator by modulating the amplifier gain with an electrical information signal, the amplifier optic input being either a stream of unmodulated optical pulses or a CW dc light input. The modulated diode laser amplifier also functions as a channel selector in a time-division-multiplexed optical communications system in which the modulating electrical signal is used to gate to the amplifier output the input optical pulses associated only with a selected one of the multiplexed channels.

11 Claims, 3 Drawing Sheets

CLOCKED OPTICAL REGENERATOR AND OTHER OPTOELECTRONIC FUNCTIONAL CIRCUITS

BACKGROUND OF THE INVENTION

This invention relates to optoelectronic functional circuits, and more particularly to a diode laser amplifier used to perform clocked optical pulse regeneration, external modulation, and selective optical channel readout.

The transmission of optical pulse signals through various optical media such as fibers or air causes both attenuation and pulse distortion due to dispersion of the pulses in the media. In order to maintain the signal amplitude at a satisfactory level, optoelectronic regenerative repeaters are required between fiber spans. Regenerators restore a weak and distorted signal to a large signal of original state. In present optical regenerator circuits, the optical signal is first converted to the electrical domain, amplified, and by clock recovery, retimed and converted back to the optical domain by modulating a transmitting semiconductor laser. Disadvantageously, the speeds of such electrical regenerators are constrained by the characteristics of the electrical components, the speeds of which are limited below those of present optical processing components. Furthermore, the optoelectric and electrooptic conversion introduce additional distortion to the signal.

An object of the present invention is to regenerate digital signals in an optical transmission system in the optical domain.

An additional object of the present invention is to optically regenerate the digital signal in a way that restores the signal to its original signal level, removes the pulse distortion, and reshapes the output pulses.

SUMMARY OF THE INVENTION

In accordance with the present invention, the pulses in an input optical data signal are regenerated by a diode laser amplifier, the gain of which is modulated by a clock signal electronically recovered from and synchronized with the input data signal. By such gain modulation, the amplifier output is amplified to a high level during essentially half of each clock cycle, and is attenuated to a near zero-level during the other half of the clock cycle. As a result, each pulse in the input signal is both amplified and "cleaned-up" to produce an output optical pulse signal that is an amplified, reshaped and correctly retimed version of the input optical signal. The modulated diode laser amplifier thus functions as an optoelectronic multiplier or AND gate that produces an output only when both the input optical signal ONE "AND" the modulating electrical signal which drives the gain of the amplifier is high.

The multiplicative function of the modulated diode laser amplifier may also be applied to create other optoelectronic functional circuits. For example, when the input optical signal consists of a stream of short optical pulses and the gain of the amplifier is modulated with an electrical non-return-to-zero (NRZ) or return-to-zero (RZ) format digital information signal that is synchronized with the input optical pulse stream, the diode laser amplifier output is an information modulated stream of RZ format optical pulses.

The modulated diode laser amplifier may also be used as channel selector in a time-division-multiplexed (TDM) optical communications system. In such a system, the input optical pulse stream, consisting of TDM NRZ or RZ format pulses, is inputed to the diode laser amplifier that is gain modulated electrically with a pulse signal synchronized in time and frequency with the channel selected for output.

DETAILED DESCRIPTION

Figure 1:
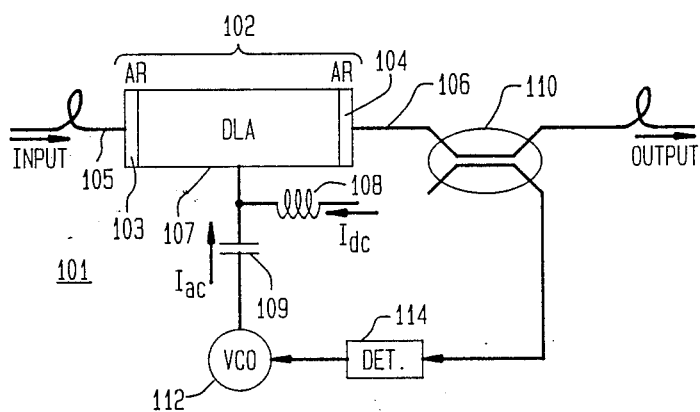
FIG. 1 is a block diagram of the clocked optical regenerator of the present invention.

With reference to FIG. 1, a block diagram of the clocked optical regenerator 101 of the present invention is shown. The regenerator includes a diode laser amplifier 102 having anti-reflection (AR) coatings 103 and 104 on its end facets. As is well known in the optical art, amplifier 102 amplifies in intensity the optical signal input at one facet to produce an amplified optical output at the other facet. The input optical signal could be in the form of a focused light beam in air or can be, as shown in FIG. 1, an optical signal transmitted through a fiber 105. The diode laser amplifier could either output the amplified signal into air or onto an optical fiber 106, as shown.

The gain of the laser diode amplifier 102 is determined by the magnitude and nature of the amplifier current pumped through the active region 107. A dc current, $I_{dc}$, normally provides a constant amplifier current to the active region thus maintaining the gain of the amplifier at a constant value. In accordance with the present invention an ac current, $I_{ac}$, is superimposed on $I_{dc}$ to modulate the amplifier current through the active region 107 of the diode laser amplifier and thus the gain of the amplifier. In order to prevent interaction between the ac and dc components, $I_{dc}$ is supplied to region 107 through an inductor 108 and $I_{ac}$ is supplied through a capacitor 109.

Figure 2:
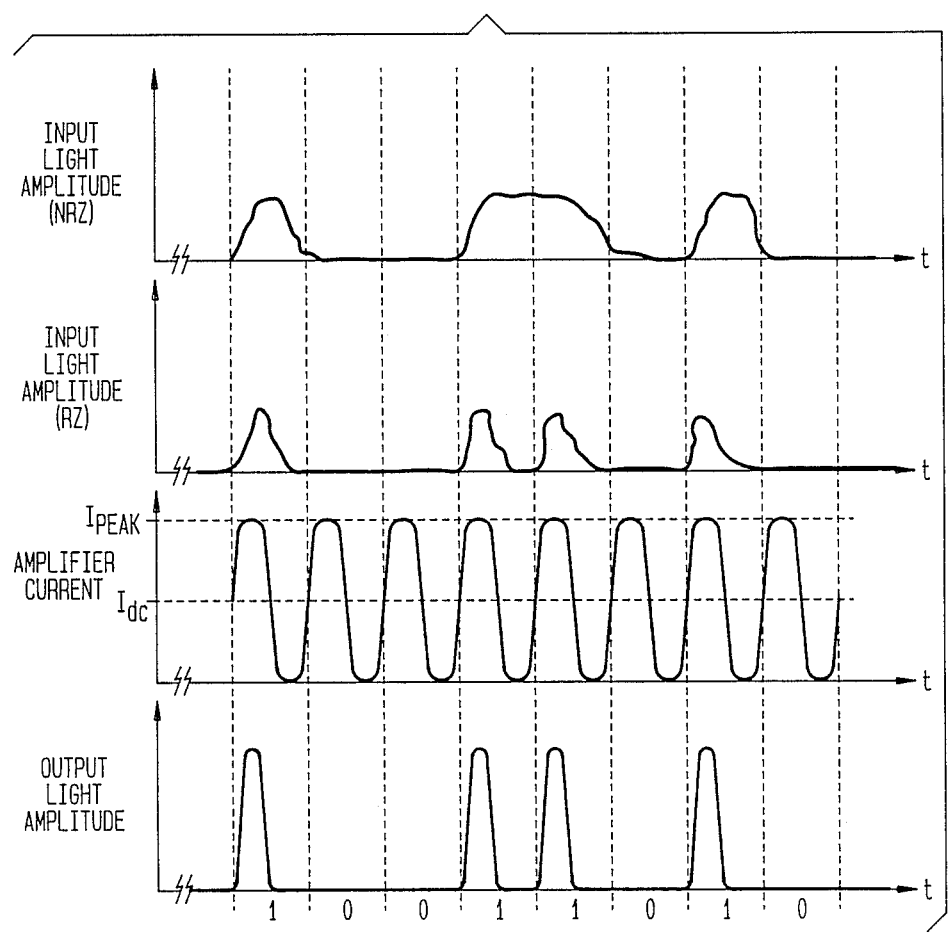
FIG. 2 shows timing diagrams useful in explaining the operation of the regenerator of FIG. 1.

By modulating the gain of amplifier 102 with a sinusoid that is locked to the clock of the input optical pulse stream on input fiber 105, the output pulse streams on fiber 106 is an amplified, reshaped and retimed version of the input. This is best explained in conjunction with the timing diagrams in FIG. 2. The input signal on fiber 105 can either be an NRZ or RZ format optical pulse signal (both alternatives are shown in the figure) which has been distorted and attenuated through transmission over long distance optical facilities. The current through the active region 107 is modulated, as shown, between a peak value, $I_{peak}$, and essentially a zero value, by a sinusoid that is locked to the clock of the the input optical signal. The gain of the laser diode amplifier is directly related to the amplifier current and thus the time variant gain (not shown) is a replica of the modulating current. An optical output is produced during only those time periods in which the gain of the amplifier is high. Therefore, only during the positive half cycle of the sinusoidally varying amplifier current does amplifier 102 amplify the signal on the input fiber 105. During the negative half of the cycle, the gain of amplifier 102 is substantially reduced thereby attenuating the magnitude of the optical input to a near zero value. The resulting output signal is an amplified version of the input signal that has been reshaped into the positive half cycle interval. Reshaping is particularly apparent for an NRZ format input signal which is converted by regenerator 101 into an RZ format output signal, the timing of which is clearly defined by the modulating amplifier current.

It has been assumed in the discussion hereinabove that the modulating signal is locked to the clock of the input optical bit stream. This is accomplished by means of clock recovery circuitry that is tied to the output of the amplifier. With reference again to FIG. 1, a portion of the output signal on fiber 106 is coupled through coupler 110 to a detector 114. As noted from the timing diagrams in FIG. 2, the output signal is a pseudo-random stream of short RZ format pulses (short being defined as having a pulse duration shorter than the clock half-period). This signal has a usable signal component at the clock frequency. The electrical output of detector 114 can thus be used to phase-lock a voltage controlled oscillator (VCO) 112 (which is providing $I_{ac}$) to the incoming clock by means of an injection locking technique. This injection locking technique is described by the applicant herein in a co-pending patent application, Ser. No. 392,118, filed Aug. 10, 1989.

The regenerator circuit in FIG. 1 can serve many optical functions. It can function as a general NRZ format to RZ format optical signal converter, since as noted above, it transforms the input optical signal to an output pulse stream of short RZ format pulses. It is also apparent that can serve as a multiplier or optoelectronic AND gate that bit-by-bit multiplies the ONEs and ZEROs in the input optical signal with a stream of ONEs and ZEROs that electrically modulate the gain of the amplifier between a peak and a zero gain value.

Figure 3:
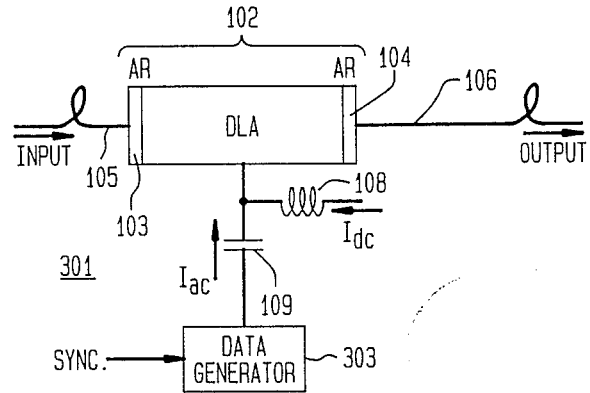
FIG. 3 is a block diagram of the present invention as used as an electrooptic modulator in an optical communications system.
Figure 4:
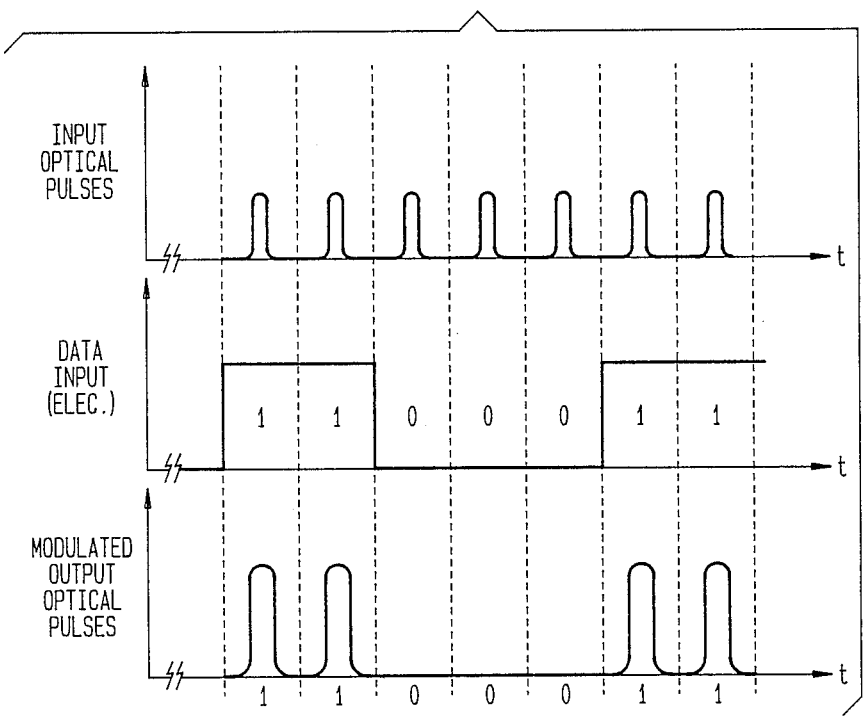
FIG. 4 shows timing diagrams useful in explaining the operation of the modulator of FIG. 3.

The current modulated diode laser amplifier can also be employed to perform other practical optoelectronic functions. When refer now to FIG. 3 which shows a block diagram of an external data modulator 301. Operation of the modulator 301 in FIG. 3 is best explained in conjunction with the associated timing diagrams in FIG. 4. Elements appearing in both FIGS. 1 and 3 are designated the same reference numerals. In the modulator 301 in FIG. 3, the input optical signal on fiber 105 is a repetitive stream of short optical pulses. The electrical signal modulating the diode laser amplifier 102 current, however, equal to $I_{dc}+I_{ac}$, is a data signal that is synchronized to the frequency of the optical pulses. This data signal, generated by data generator 303, modulates the amplifier current between a position value and an essentially zero value in accordance with the ONEs and ZEROs of the data, thereby modulating the gain of the amplifier between a high value and zero. Each short optical input pulse is therefore either amplified and outputted onto fiber 106 or is attenuated to zero, in accordance with the modulating electrical data signal. As noted in FIG. 4, the optical output signal on fiber 106 is therefore an RZ format signal that is modulated in accordance with the input electrical signal.

In FIG. 3, if the input signal to amplifier 102 on fiber 105 is CW dc light rather than a stream of optical pulses, then the modulating NRZ electrical data signal generated by data generator 303 modulates the input CW optical signal into an output digital optical signal consisting of NRZ pulses. Similarly, if the electrical information modulating signal has an RZ format, the output light signal will consist of RZ modulated pulses.

Figure 5:
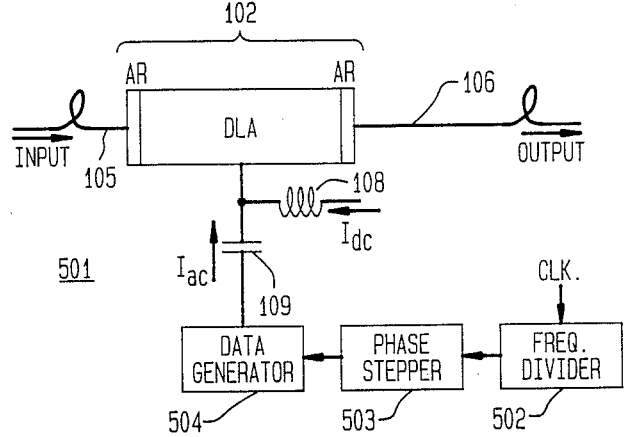
FIG. 5 is a block diagram of the present invention as used as channel selector in a TDM optical communications system.
Figure 6:
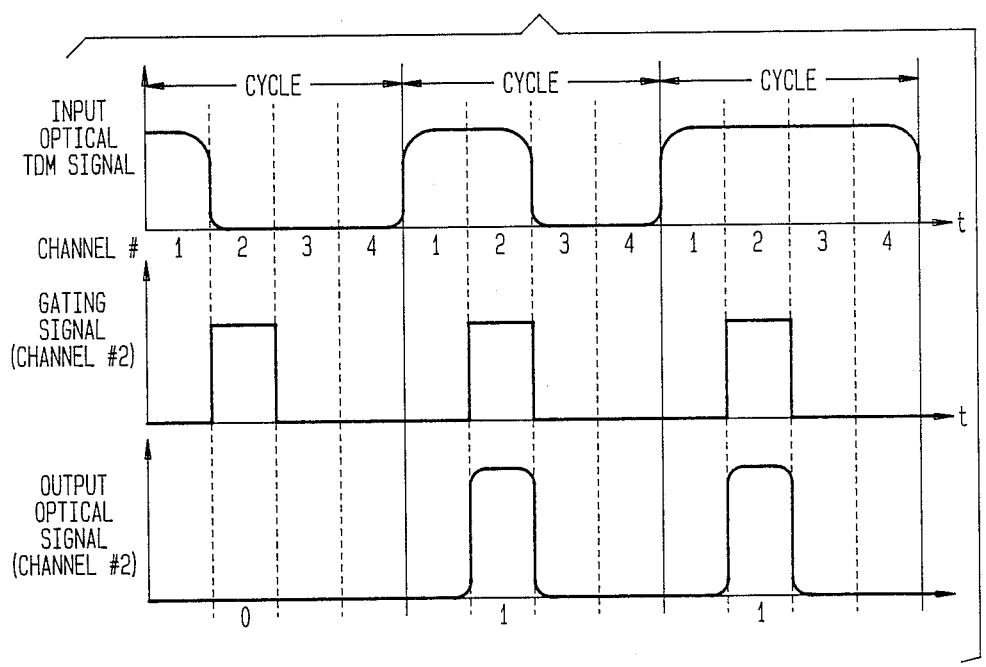
FIG. 6 shows timing diagrams useful in explaining the operation of the channel selector of FIG. 5.

As illustrated in FIG. 5, the modulated diode laser amplifier of the present invention can also be employed as a channel selector in a time-division-multiplexed optical communications system. Again, similar numerical designations are given elements common to the other aforedescribed figures. The channel selector 501 in FIG. 5 will be explained in conjunction with the associated timing diagrams in FIG. 6. The incoming optical signal on input fiber 105 is a time-division multiplexed NRZ format data signal. For illustrative purposes, as shown in FIG. 6, four channels are multiplexed per cycle. Diode laser amplifier 102 amplifies and gates to output fiber 106 only those pulses associated with a selected one of the four channels. This is accomplished by modulating the gain of diode laser amplifier 102 high only during those intervals during which pulses associated with the desired channel are present on fiber 105. In FIG. 5, an incoming clock signal CLK is input to a divider circuit 502. The CLK clock signal is recovered from the incoming optical input data by means which are well known in the art, and is therefore locked in frequency to the input signal. Divider 502 divides the recovered clock signal by the number of multiplexed channels, N, equal in the illustrative example, to four. A phase stepper 503 steps the resultant divided clock signal to the desired one-in-four time slots associated with the selected channel to be read-out. The output of phase stepper 503 is connected to a pulse generator 504 which generates, as shown in FIG. 6, a gating pulse sychronously with the time slot associated with the selected channel. These gating pulses thus increase the gain of diode laser amplifier 102 to a high level only during the selected time slot in each cycle thereby passing to the output fiber 106 only the information in the multiplexed stream that is associated with the selected channel. In FIG. 6, the selected channel is channel number 2.

The above-described embodiments are illustrative of the principles of the present invention. Other embodiments could be devised by those skilled in the art without departing from the spirit and scope of the present invention.

What is claimed is:

1. An optical pulse regenerator comprising:
   a diode laser amplifier having an input for receiving an optical input signal and an output for outputting an amplifier optical output signal, and having a gain determined by an applied amplifier current;
   means for receiving an optical pulse signal at said input;
   means for generating an electrical modulating signal which is synchronizing with the clock signal component in the output signal at said optical output, said means for generating comprising means for deriving an electrical signal from a portion of the output signal, a voltage controlled oscillator, and means for injection-locking said voltage controlled oscillator to said derived electrical signal; and
   means for modulating signal, said modulating said electrical modulating signal, said modulating amplifier current modulating the gain of said amplifier between a high and low value in each clock cycle, said amplifier producing an amplified optical output substantially only during that portion of each clock cycle when both the gain is high and an optical pulse is present at the amplifier input;

wherein an optical pulse stream is produced at said output which is an amplified, reshaped and retimed version of said input pulse signal.

2. An optical regenerator in accordance with claim 1 wherein said input optical signal has an NRZ format.

3. An optical regenerator in accordance with claim 1 wherein said input optical signal has an RZ format.

4. An optical regenerator in accordance with claim 1 wherein said electrical modulating signal is a sinusoid.

5. An optical regenerator in accordance with claim 1 wherein the gain of said amplifier is molulated between a high value and substantially zero.

6. An optoelectronic channel selector for use in a time-division-multiplexed (TDM) optical communications system comprising:

a diode laser amplifier having an input for receiving an optical input signal, and an output for outputting an amplified optical output signal, and having a gain determined by an applied amplifier current;

means for receiving a TDM optical bit stream at said input;

means for deriving an electrical channel select signal in synchronism with said TDM bit stream, said channel select signal being ON in each TDM cycle during the time slot associated with the selected channel; and means for modulating said amplifier current with said electrical channel select signal, said modulating amplifier current modulating the gain of said amplifier high only when said channel select signal is ON in each TDM cycle;

wherein the optical output of said amplifier represents the amplified optical input signal for the selected channel.

7. A diode laser amplifier circuit comprising:

a diode laser amplifier having an input for receiving an optical input signal and an output for outputting an amplified optical output signal;

means for applying an amplifier direct current to said amplifier;

detector means connected to said amplifier output, means for superimposing an amplifier alternating current on said amplifier direct current, said superimposing means including a voltage controlled oscillator connected to said detector means, said amplifier alternating current being synchronized with a clock signal component in the output signal at said amplifier output;

whereby the gain of said amplifier is determined by the sum of said direct and alternating currents and said amplifier produces an amplified optical output substantially only when both the gain of said amplifier is high and an optical pulse is present at said amplifier input.

8. A diode laser amplifier circuit comprising:

a diode laser amplifier having an input for receiving an optical input signal and an output for outputting an amplified optical output signal;

means for applying an amplifier direct current to said amplifier;

means for superimposing an amplifier alternating current on said amplifier direct current, said superimposing means including a data generator;

whereby the gain of said amplifier is determined by the sum of said direct and alternating currents and said amplifier produces an amplified optical output substantially only when both the gain of said amplifier is high and an optical pulse is present at said amplifier input.

9. A diode laser amplifier circuit comprising:

a diode laser amplifier having an input for receiving an optical input signal and an output for outputting an amplified optical output signal;

means for applying an amplifier direct current to said amplifier;

means for superimposing an amplifier alternating current on said amplifier direct current, said superimposing means including means for defining a channel selection signal;

whereby the gain of said amplifier is determined by the sum of said direct and alternating currents and said amplifier produces an amplified optical output substantially only when both the gain of said amplifier is high and an optical pulse is present at said amplifier input, and whereby the optical output of said amplifier represents an amplified optical input signal occurring during the selected channel in a time-division-multiplexed bit stream.

10. An optoelectronic data modulator comprising:

a diode laser amplifier having an input for receiving an optical input signal and an output for outputting an amplified optical output signal, and having a gain determined by an applied amplifier current, said input signal being a stream of short optical pulses; and means for modulating said amplifier current with a digital electrical information signal that is synchronized with said input stream, said modulating amplifier current modulating the gain of said amplifier between a high and low value in accordance with the ONEs and ZEROs, respectively, in said digital electrical information signal, said amplifier producing an amplified optical output substantially only when the gain is high;

wherein said amplified optical output varies in intensity in accordance with the ONEs and ZEROs in said digital electric information signal.

11. An optoelectronic data modulator comprising:

a diode laser amplifier having an input for receiving an optical input signal and an output for outputting an amplified optical output signal, and having a gain determined by an applied amplifier current, said input signal being CW dc light; and means for modulating said amplifier current with a digital electrical information signal, said modulating amplifier current modulating the gain of said amplifier between a high and low value in accordance with the ONEs and ZEROs, respectively, in said digital electrical information signal, said amplifier producing an amplified optical output substantially only when the gain is high;

wherein said amplified optical output varies in intensity in accordance with the ONEs and ZEROs in said digital electric information signal.

* * * * *

UNITED STATES PATENT AND TRADEMARK OFFICE
CERTIFICATE OF CORRECTION

PATENT NO. : 4,980,891

DATED : December 25, 1990

INVENTOR(S) : Hossein Izadpanah

It is certified that error appears in the above-identified patent and that said Letters Patent is hereby corrected as shown below:

On the title page:
In the Abstract, line 12, "produce" should read --to produce--.
Column 1, line 28, "conversion" should read --conversions--.
Column 1, line 67, "as channel" should read --as a channel--.
Column 2, line 18, "as channel" should read --as a channel--.
Column 3, line 44, "When" should read --We--.
Column 3, line 56, "position" should read --positive--.
Column 4, line 38, "the selected" should read --that selected--.
Column 4, line 52, "amplifier" should read --amplified--.
Column 4, line 57, "synchronizing" should read --synchronized--.
Column 4, line 64, after "means for modulating" insert --said amplifier current with said electrical modulating--.
Column 5, line 8, "optical signal" should read --optical pulse signal--.
Column 5, line 10, "optical signal" should read --optical pulse signal--.

Signed and Sealed this

Sixth Day of October, 1992

*Attest:*

DOUGLAS B. COMER

*Attesting Officer*   Acting Commissioner of Patents and Trademarks